US012642015B2

(12) United States Patent
Das et al.

(10) Patent No.: US 12,642,015 B2
(45) Date of Patent: *May 26, 2026

(54) METHODS OF FORMING CONFORMAL TRANSITION METAL DICHALCOGENIDE FILMS FOR MEMORY AND LOGIC APPLICATIONS

(71) Applicant: Applied Materials, Inc., Santa Clara, CA (US)

(72) Inventors: Chandan Das, Singapore (SG); Susmit Singha Roy, Campbell, CA (US); Bhaskar Jyoti Bhuyan, San Jose, CA (US); Supriya Ghosh, San Jose, CA (US); Jiecong Tang, Singapore (SG); John Sudijono, Singapore (SG); Abhijit Basu Mallick, Palo Alto, CA (US); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 219 days.

This patent is subject to a terminal disclaimer.

(21) Appl. No.: 17/562,441

(22) Filed: Dec. 27, 2021

(65) Prior Publication Data

US 2023/0207314 A1    Jun. 29, 2023

(51) Int. Cl.
*H10P 14/20* (2026.01)
(52) U.S. Cl.
CPC ........ *H10P 14/3434* (2026.01); *H10P 14/203* (2026.01)

(58) Field of Classification Search
CPC ......... H01L 21/02565; H01L 21/02614; H01L 21/02568; H01L 21/02271; H10P 14/3434;
(Continued)

(56) References Cited

U.S. PATENT DOCUMENTS 9,721,963 B1 * 8/2017 Rabkin .................. H01L 29/24
10,731,249 B2 * 8/2020 Hatanpää .......... C23C 16/45553
(Continued)

FOREIGN PATENT DOCUMENTS

EP        3767005 A1    1/2021
JP     2017061743 A    3/2017
(Continued)

OTHER PUBLICATIONS

PCT International Search Report and Written Opinion in PCT/US2022/035237 dated Oct. 20, 2022, 10 pages.
(Continued)

*Primary Examiner* — Jeff W Natalini
*Assistant Examiner* — Zhijun Xu
(74) *Attorney, Agent, or Firm* — SERVILLA WHITNEY LLC

(57) ABSTRACT

Transition metal dichalcogenide films and methods for depositing transition metal dichalcogenide films on a substrate are described. Methods for converting transition metal oxide films to transition metal dichalcogenide films are also described. The substrate is exposed to a metal precursor and an oxidant to form a transition metal oxide film; the transition metal oxide film is exposed to a chalcogenide precursor to form the transition metal dichalcogenide film.

18 Claims, 2 Drawing Sheets

(58) Field of Classification Search

CPC ........ H10P 14/203; H10P 14/20; H10P 14/24; H10P 14/3436

See application file for complete search history.

(56) References Cited

U.S. PATENT DOCUMENTS

| | | | |
|---|---|---|---|
| 11,430,666 B2 | 8/2022 | Chuu et al. | |
| 2008/0081922 A1* | 4/2008 | Meiere | C07F 7/10 556/51 |
| 2010/0261304 A1* | 10/2010 | Chang | H01L 31/1836 257/E51.026 |
| 2016/0233322 A1* | 8/2016 | Yeh | H01L 21/02565 |
| 2016/0379822 A1* | 12/2016 | Yang | H01L 21/3065 438/458 |
| 2017/0012117 A1 | 1/2017 | Edenilson | |
| 2017/0088945 A1* | 3/2017 | Chueh | C23C 14/083 |
| 2018/0212147 A1 | 7/2018 | Ruiz et al. | |
| 2018/0226248 A1 | 8/2018 | Jahangir et al. | |
| 2019/0074180 A1 | 3/2019 | Park et al. | |
| 2020/0161129 A1* | 5/2020 | Mattinen | H01L 29/78681 |
| 2021/0074543 A1 | 3/2021 | Kim et al. | |
| 2021/0388503 A1* | 12/2021 | Hämäläinen | H10N 70/00 |
| 2022/0320526 A1 | 10/2022 | Song et al. | |
| 2022/0384197 A1 | 12/2022 | Deijkers et al. | |
| 2022/0411918 A1 | 12/2022 | Das et al. | |
| 2023/0024913 A1 | 1/2023 | Byun et al. | |
| 2023/0207314 A1 | 6/2023 | Das et al. | |
| 2023/0307551 A1 | 9/2023 | Yoo et al. | |

FOREIGN PATENT DOCUMENTS

| | | |
|---|---|---|
| JP | 2019121777 A | 7/2019 |
| JP | 2020084323 A | 6/2020 |
| JP | 2020088390 A | 6/2020 |
| JP | 2021038459 A | 3/2021 |
| KR | 20190014761 A | 2/2019 |
| WO | 2019092521 A1 | 5/2019 |
| WO | 2019232344 A1 | 12/2019 |
| WO | 2021030327 A1 | 2/2021 |

OTHER PUBLICATIONS

U.S. Appl. No. 17/361,231, filed Jun. 28, 2021, 26 pages.

Groven, Benjamin , et al., "Two-Dimensional Crystal Grain Size Tuning in WS2 Atomic Layer Deposition: An Insight in the Nucleation Mechanism", Chem. Mater. 2018, 30, 7648-7663.

Lo, Chun-Li , et al., "Studies of two-dimensional h-BN and MoS2 for potential diffusion barrier application in copper interconnect technology", NPJ 2D Materials and Applications (2017) 1:42, 7 pages.

Manzeli, Sajedeh , et al., "2D transition metal dichalcogenides", Nature Review Materials, vol. 2, Article No. 10733, Jun. 13, 2017.

Sebastian, Amritanand , et al., "Benchmarking monolayer MoS2 and WS2 field-effect transistors", Nature Communications (2021) 12:693, 12 pages.

Sharma, Akhil , et al., "Low-temperature plasma-enhanced atomic layer deposition of 2-D MoS2: large area, thickness control and tuneable morphology", The Royal Society of Chemistry, Nanoscale (2018), 14 pages.

PCT International Search Report and Written Opinion in PCT/US2022/053939 mailed Apr. 28, 2023, 9 pages.

Non-Final Office Action in U.S. Appl. No. 17/361,231, dated Jan. 9, 2024, 10 pages.

PCT International Search Report and Written Opinion in PCT/US2025/014545 dated May 13, 2025, 10 pages.

Wu, et al., "A Self-Limited Atomic Layer Deposition of WS2 Based on the Chemisorption and Reduction of Bis(t-butylimino)bis(dimethylamino) Complexes.", Chem. Mater. 2019, 31, 1881-1890 and in further view of Deijkers et al. (US 2022/0384197) hereinafter "Deijkers" (Year: 2019).

PCT International Search Report and Written Opinion in PCT/US2024/041210 dated Nov. 15, 2024, 10 pages.

"PCT International Search Report and Written Opinion in PCT/US2025/040893 dated Dec. 2, 2025, 12 pages".

* cited by examiner

METHODS OF FORMING CONFORMAL TRANSITION METAL DICHALCOGENIDE FILMS FOR MEMORY AND LOGIC APPLICATIONS

TECHNICAL FIELD

Embodiments of the disclosure generally relate to methods of forming transition metal dichalcogenides (TMDC). In particular, embodiments of the disclosure are directed to methods of forming TMDC films for memory and logic applications.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Unfortunately, there is a limited number of viable chemical precursors available that have the requisite properties of robust thermal stability, high reactivity, and vapor pressure suitable for film growth to occur.

Transition metal dichalcogenides (TMDC) are known to be great candidates to mitigate the issue of metal migration associated with interconnect downscaling of films. Moreover, TMDC possess better conductivity and carrier mobility compared to current processes in 3D NAND devices. Recent TMDC methods require high temperature processes which may not be compatible with device thermal budgets.

Therefore, there is a need for conformal TMDC that can be grown by low temperature thermal processes suitable for device integration in temperature sensitive structures.

SUMMARY

One or more embodiment of the disclosure are directed to a method of forming a transition metal dichalcogenide film.

The method comprises depositing a transition metal oxide film on a substrate surface; and converting the transition metal oxide film to a transition metal dichalcogenide film.

Additional embodiments of the disclosure are directed to a method of forming a transition metal dichalcogenide film on a substrate surface comprising at least one feature. The method comprises sequentially exposing the substrate surface to a metal precursor and an oxidant to directly deposit a transition metal oxide film. The metal precursor comprises bis(t-butylimino) bis(dimethylamino) tungsten or bis(t-butylimino) bis(dimethylamino) molybdenum. The transition metal oxide film is substantially conformal over the at least one feature. The transition metal oxide film is exposed to a chalcogenide precursor to convert the transition metal oxide film to a transition metal dichalcogenide film. The chalcogenide precursor comprises $H_2S$, and the transition metal dichalcogenide film has a thickness in a range of 20 Å to 30 Å. The substrate surface is maintained at a temperature in a range of about 350° C. to about 450° C.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figures 1, 2:
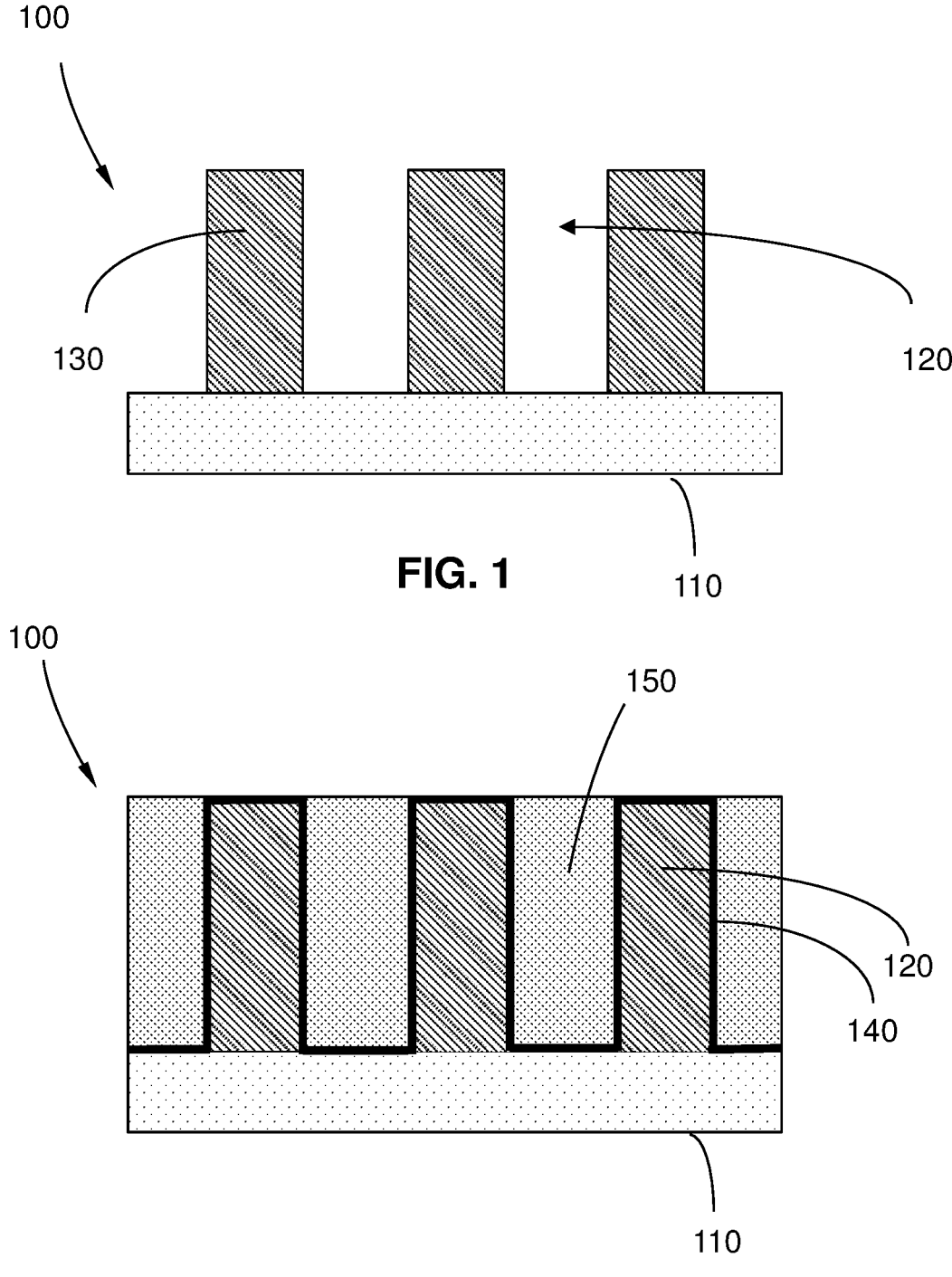
FIG. 1 illustrates a cross-sectional view of a substrate in accordance with one or more embodiment of the disclosure.
FIG. 2 illustrates a cross-sectional view of a substrate in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

As used herein, the term "substantially free of oxygen" means that there is less than or equal to about 5%, including less than or equal to about 4%, less than or equal to about 3%, less or equal to than about 2%, less than or equal to about 1%, and less than or equal to about 0.5% of oxygen, on an atomic basis, in the transition metal dichalcogenide film.

A "substrate" may include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the disclosed methods, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the transition metal dichalcogenide layer may be at least partially formed thereon. For example, in some embodiments, a layer comprising a metal, a nitride, an oxide, or the like, or combinations thereof may be disposed on the substrate and may have the transition metal dichalcogenide layer formed upon such layer or layers.

According to one or more embodiment, the term "on", with respect to a film or a layer of a film, includes the film or layer being directly on a surface, for example, a substrate surface, as well as there being one or more underlayers between the film or layer and the surface, for example the substrate surface. Thus, in one or more embodiment, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

According to one or more embodiment, the disclosed method utilize an atomic layer deposition (ALD) process. In such embodiments, the substrate surface is exposed to the precursors (or reactive gases) sequentially. As used herein throughout the specification, "sequentially" means that the duration of a precursor exposure does not intentionally overlap with the exposure to a co-reagent in a manner intended to create a gas phase reaction. It is understood that while some overlap may occur, this overlap is unintentional.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is only substantially exposed to one reactive compound at a time. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface.

In some embodiments, the ALD process of pulsing compound A, purge gas, compound B and purge gas is a cycle. A cycle can start with either compound A or compound B and continue the respective order of the cycle until achieving a film with the desired thickness. In some embodiments, there may be two reactants, A and B, that are alternatingly pulsed and purged.

In some embodiments, there may be three or more reactants, A, B, and C, that are alternatingly pulsed and purged. In some embodiments, each reactant is utilized during each deposition cycle (e.g., A-B-C). In some embodiments, a series of alternating exposures to compounds A and B may be performed before exposure to compound C (e.g., A-B-A-B-C).

In a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure provide methods of forming transition metal dichalcogenide films for use as a channel material, liner or barrier layer in the miniaturization and scaling of integrated circuits. In one or more embodiment, transition metal dichalcogenide films act as a barrier or liner in 3D NAND applications. For example, the transition metal dichalcogenide film acting as a barrier/liner may enable nucleation of a subsequently deposited metal, adhesively bind a metal to underlying dielectric materials, and block diffusion of metal elements to underlying dielectric materials.

In one or more embodiment, transition metal dichalcogenide films act as a channel material in 3D NAND applications. In one or more embodiment, transition metal dichalcogenide films have better carrier mobility than poly-silicon, as an example. The carrier mobility of the transition metal dichalcogenide films may improve 3D NAND device performance.

Embodiments of the disclosure provide a low thermal budget approach to achieve high-quality 2D-transition metal dichalcogenide films for temperature-sensitive device architectures.

With reference to FIG. 1, a substrate 100 including a base material 110 having at least one feature 120 formed from a material 130 is shown. The surfaces of the base material 110 and the material 130 form the substrate surface. In some embodiments, the base material 110 and the material 130 are the same. In some embodiments, the base material 110 is a metal or other conductive material. In some embodiments, the material 130 is a dielectric. The Figures show a substrate having three features for illustrative purposes; however, those skilled in the art will understand that there can be more or less than three features. In one or more embodiment, the substrate 100 comprises at least one feature 120.

The shape of the feature 120 can be any suitable shape including, but not limited to, trenches and cylindrical vias. As used in this regard, the term "feature" means any intentional surface irregularity. Suitable examples of features include but are not limited to trenches which have two sidewalls and a bottom, and peaks which have a top and two sidewalls. Features can have any suitable aspect ratio (ratio of the height/depth to the width). In some embodiments, the aspect ratio is greater than or equal to about 5:1, 10:1, 15:1, 20:1, 25:1, 30:1, 35:1 or 40:1. In one or more embodiment, the at least one feature 120 is a trench. In one or more embodiment, the at least one feature 120 is a dielectric material and a conductive material. In one or more embodiment, a transition metal oxide film (not shown) forms selectively on the dielectric material.

With reference to FIG. 2, each of the at least one feature 120 has a transition metal dichalcogenide film 140 deposited thereon. In one or more embodiment, the substrate 100 includes a metal fill 150 that is deposited on the transition metal dichalcogenide film 140 in each of the at least one features 120. In one or more embodiment, the metal fill 150 comprises a high-conductivity metal. In some embodiments, the metal fill 150 comprises one or more of copper (Cu), cobalt (Co), tungsten (W), molybdenum (Mo), or ruthenium (Ru).

Embodiments of the disclosure are directed to methods of forming a transition metal dichalcogenide film. In one or more embodiment, the method of depositing the film comprises forming a transition metal oxide film on a substrate surface and subsequently converting the transition metal oxide film to a transition metal dichalcogenide film.

In some embodiments, the transition metal oxide film is directly formed without forming a transition metal film intermediate. The inventors have surprisingly found that the formation of certain metals (e.g., tungsten) on dielectric layers is more difficult (e.g., longer processing times, elevated temperatures) than the formation of metal oxides. Further, the formation of a metal layer which is subsequently oxidized requires more processing time and decreases processing throughput. Accordingly, some embodiments of the disclosure advantageously provide methods of forming a transition metal oxide film without the formation of a metal film intermediate.

In some embodiments, the substrate surface does not contain a barrier layer. Without being bound by theory, it is believed that the formation of a metal layer without a barrier leads to the possible diffusion of the metal into the underlying material(s). The inventors have surprisingly found that diffusion from metal oxide materials is significantly lower. In some embodiments, the diffusion of metal atoms from metal oxide materials is low enough that the benefits of a barrier layer are negligible. Accordingly, the elimination of the barrier layer from a process flow is expected to decreasing processing time, increase throughput, and decrease resistance of the metal fill since the fill will be larger in volume.

In one or more embodiment, the transition metal oxide film is sulfurized using thermal $Ar/H_2S$ or $H_2/H_2S$ gas. In one or more embodiment, the transition metal oxide film is sulfurized using a plasma formed from $Ar/H_2S$ or $H_2/H_2S$ gas. In one or more embodiment, the transition metal oxide film having tungsten (W) is converted to $WS_2$ by one or more of the sulfurization processes described herein.

In one or more embodiment, converting the transition metal oxide film to the transition metal dichalcogenide film is conducted at a plasma power in a range of from 25 watts (W) to 500 watts (W).

In one or more embodiment, the transition metal oxide film is converted to the transition metal dichalcogenide film after forming the transition metal oxide film having a thickness in a range of 10 Å to 50 Å, or in a range of 15 Å to 35 Å, in a range of 15 Å to 25 Å, or in a range of 20 Å to 30 Å. In some embodiments, the transition metal oxide film is converted to the transition metal dichalcogenide film after forming 1 monolayer, 1-5 monolayers or 1-10 monolayers of the transition metal oxide.

In one or more embodiment, the method further comprises repeating forming the transition metal oxide film and converting the transition metal oxide film to form a transition metal dichalcogenide film with a final thickness up to 200 Å. In one or more embodiment, the transition metal dichalcogenide film has a final thickness up to 150 Å, up to 100 Å, or up to 50 Å. In some embodiments, the transition metal dichalcogenide film has a final thickness in a range of 20 Å to 30 Å.

In one or more embodiment, converting the transition metal oxide film to the transition metal dichalcogenide film is conducted at a temperature in a range of about 350° C. to about 500° C. In some embodiments, converting the transition metal oxide film to the transition metal dichalcogenide film is conducted at a pressure in a range of from 1 Torr to 20 Torr, in a range of 1 Torr to 10 Torr, in a range of 5 Torr to 20 Torr, or in a range of 5 Torr to 10 Torr.

In one or more embodiment, converting the transition metal oxide film to the transition metal dichalcogenide film is conducted for a time period in a range of from 30 minutes to 60 minutes. In one or more embodiment, converting the transition metal oxide film to the transition metal dichalcogenide film comprises exposing the transition metal oxide film to a chalcogenide precursor comprising one or more of sulfur (S), selenium (Se) or tellurium (Te). In some embodiments, the chalcogenide precursor comprises $H_2S$.

Figure 3:
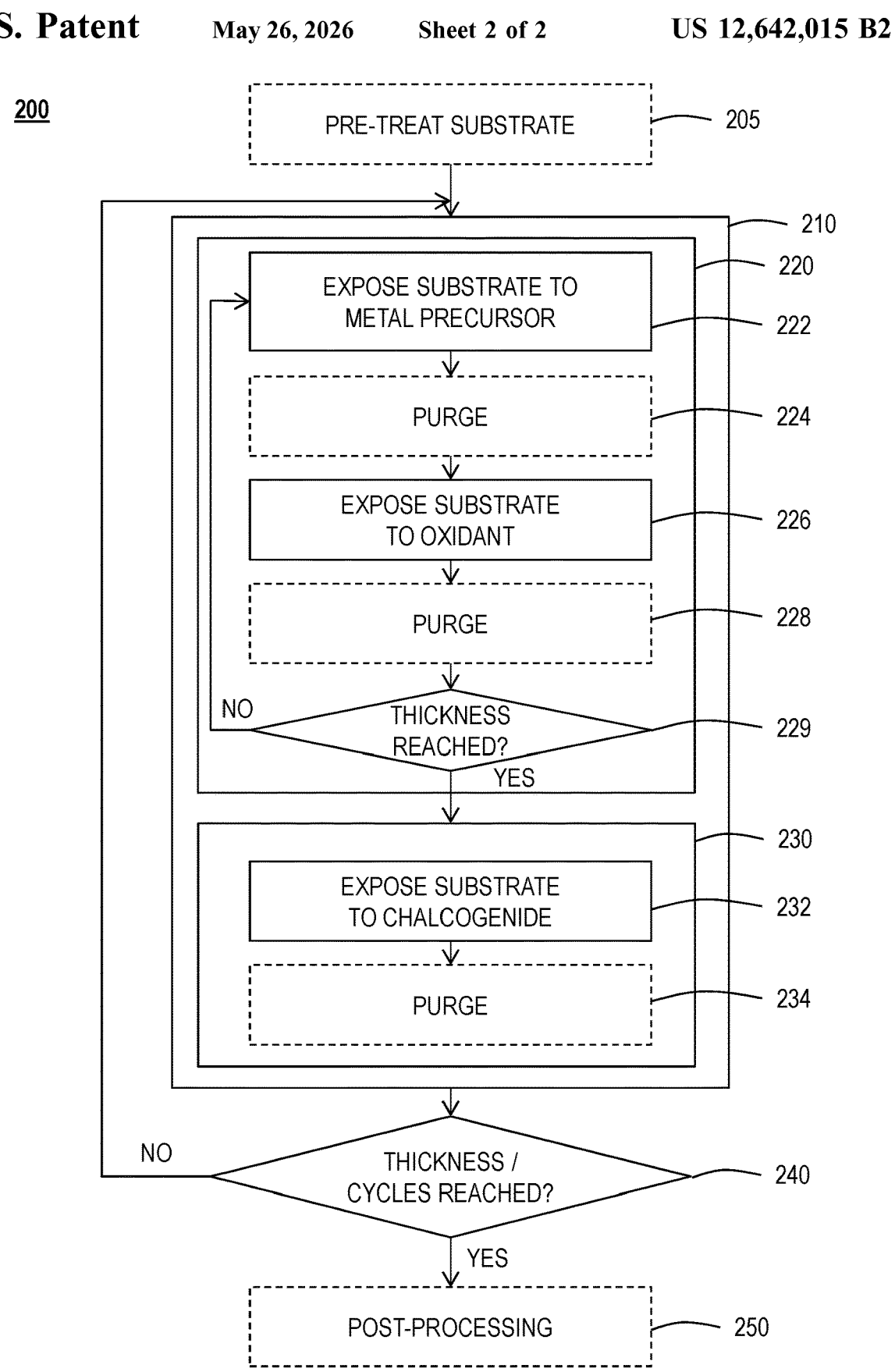
FIG. 3 illustrates a process flow diagram of a method in accordance with one or more embodiment of the disclosure.

With reference to FIG. 3, one or more embodiment of the disclosure is directed to a method 200 of forming a transition metal dichalcogenide film. The method illustrated in FIG. 3 is representative of an atomic layer deposition (ALD) process in which the substrate or substrate surface is exposed sequentially to the reactive gases in a manner that prevents or minimizes gas phase reactions of the reactive gases. In so doing, the method avoids a chemical vapor deposition (CVD) process in which the reactive gases are mixed in the processing chamber to allow gas phase reactions of the reactive gases.

In one or more embodiment of the disclosure, the method 200 comprises optionally pre-treating the substrate at operation 205. A transition metal dichalcogenide film is formed on the in a deposition process cycle 210. The deposition process cycle 210 can be understood in two phases 220, 230. A first phase 220 comprising operation 222, 224, 226 and 228 forms a transition metal oxide film on the substrate surface. A second phase 230 comprising operation 232, 234 converts the transition metal oxide film to a transition metal dichalcogenide film.

In some embodiments, the second phase 230 is performed after the first phase 220 has deposited a predetermined thickness of the transition metal oxide film. In some embodiments, the second phase 230 is performed after a single operation of the first phase 220. In some embodiments, the second phase 230 is performed after multiple cycles of the first phase 220.

The first phase 220 comprises the sequential exposure of the substrate to a transition metal precursor at operation 212, the optional purging of the substrate surface at operation 214, the exposure of the substrate to an oxidant at operation 216, and optional purging the substrate surface at operation 218.

The second phase 230 comprises the sequential exposure of the substrate to a chalcogenide precursor at operation 232 and the optional purging of the substrate surface at operation 234.

In some embodiments, the method 200 optionally includes a pre-treatment operation 205. The pre-treatment can be any suitable pre-treatment known to the skilled artisan. Suitable pre-treatments include, but are not limited to, pre-heating, cleaning, soaking, native oxide removal, or deposition of an adhesion/barrier layer (e.g., titanium nitride (TiN)). In one or more embodiment, an adhesion layer, such as titanium nitride, is deposited at operation 205. In some embodiments, as described above, the substrate surface does not contain a barrier layer. In one or more embodiment, the optional pre-treatment operation 205 includes flowing plasma gas comprising one or more of $Ar/O_2$, $Ar/H_2$, or $Ar/H_2S$ followed by $Ar/H_2$.

Regarding the first phase 220 of deposition process cycle 210, in one or more embodiment, at operation 222, the substrate (or substrate surface) is exposed to a metal precursor to form a reactive metal species on the substrate surface. The transition metal precursor can be any suitable transition metal containing compound that can react (i.e., adsorb or chemisorb onto) the substrate surface to leave a transition metal containing species on the substrate surface.

In one or more embodiment, the metal precursor comprises one or more of tungsten, molybdenum, tantalum, titanium, or ruthenium. In some embodiments, the metal precursor does not comprise oxygen or halogen atoms. In some embodiments, the metal precursor comprises or consists essentially of one or more of bis(t-butylimino) bis (dimethylamino) tungsten or bis(t-butylimino) bis(dimethylamino) molybdenum.

At operation 224, the processing chamber or substrate surface is optionally purged to remove unreacted metal precursor, reaction products and byproducts. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the transition metal oxide precursor by any suitable technique including, but not limited to, moving the substrate through a gas curtain to a portion or sector of the processing chamber that contains none or substantially none of the metal precursor.

In one or more embodiment, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiment, the purge gas is selected from one or more of nitrogen ($N_2$), helium (He), and argon (Ar).

At operation 226, the substrate (or substrate surface) is exposed to an oxidant to form a transition metal oxide film on the substrate. The oxidant (also referred to as an oxide reactant) may be any suitable compound for oxidizing the absorbed metal precursor to form a transition metal oxide film. In some embodiments, the oxidant comprises one or more of $H_2O$, $O_2$ or $O_3$. In some embodiments, the oxidant does not comprise a plasma. In some embodiments, the transition metal oxide film is stoichiometric. As used in this regard, a "stoichiometric" film has a metal:oxygen ratio within 95% of the commonly accepted stoichiometric ratio (e.g. $WO_3$).

At operation 228, the processing chamber is optionally purged after exposure to the chalcogenide reactant. Purging the processing chamber in operation 228 can be the same process or different process than the purge in operation 224. Purging the processing chamber, portion of the processing chamber, area adjacent the substrate surface, etc., removes oxidant (oxide reactant), reaction products and byproducts from the area adjacent the substrate surface. In one or more embodiment, at operation 228, the processing chamber is optionally purged after exposure to the oxidant.

At decision 229, the thickness of the transition metal oxide film, or number of cycles of precursor and oxidant is considered. If the transition metal oxide film has reached a predetermined thickness or a predetermined number of process cycles have been performed, the method 200 moves to a second phase 230. If the thickness of the transition metal oxide film or the number of process cycles has not reached the predetermined threshold, the method 200 returns to operation 222 repeat the first phase 220. As identified above, in some embodiments, the transition metal oxide film may be formed to a predetermined thickness in the first phase 220 before being converted to a transition metal dichalcogenide in the second phase 230. In some embodiments, a predetermined number of monolayers (as few as 1) of the transition metal oxide film may be formed before being converted to a transition metal dichalcogenide in the second phase 230.

In the second phase 230, the transition metal oxide film formed in the first phase 220 is converted to a transition metal dichalcogenide film. In some embodiments, converting the transition metal oxide film comprises exposing the transition metal oxide film to a chalcogenide precursor at operation 232. The chalcogenide precursor comprises one of more of S, Se or Te. In some embodiments, the chalcogenide precursor comprises $H_2S$. In some embodiments, the chalcogenide precursor further comprises $H_2$. In some embodiments, the chalcogenide precursor does not comprise a plasma.

At operation 234, the processing chamber or the substrate surface may be purged. The inventors have found that purging the processing chamber at operation 234 is particularly relevant if returning to the first phase 220 to deposit additional transition metal oxide film. Without being bound by theory, it is believed that the purge at operation 234 provides a "clean" substrate surface which enhances the adsorption of the metal precursor in operation 222. Otherwise, the descriptors of the purges performed at operation 224 or operation 228, both in operation and composition, also apply to operation 234.

In one or more embodiment, the deposited film is substantially free of oxygen. As used herein, "substantially free" means that there is less than or equal to about 5%, including less than or equal to about 4%, less than or equal to about 3%, less than or equal to about 2%, less than or equal to about 1%, or less than or equal to about 0.5% of oxygen, on an atomic basis, in the transition metal dichalcogenide film. Accordingly, without intending to be bound by theory, it is thought that the transition metal dichalcogenide film that is formed without producing oxygen as a byproduct, thus minimizing the potential to etch/corrode underlying metal layers.

At decision 240, the thickness of the transition metal dichalcogenide film, or number of cycles of the deposition process cycle 210. If the transition metal dichalcogenide film has reached a predetermined thickness or a predetermined number of cycles have been performed, the method 200 moves to an optional post-processing operation 250. If the thickness of the transition metal dichalcogenide film or the number of cycles has not reached the predetermined threshold, the method 200 returns to operation 210 to form additional transition metal dichalcogenide film.

The optional post-processing operation 250 can be, for example, a process to modify film properties (e.g., annealing) or a further film deposition process (e.g., additional ALD or CVD processes) to grow additional films.

The method 200 can be performed at any suitable temperature depending on, for example, the metal precursor, oxidant, chalcogenide reactant, or thermal budget of the device. In one or more embodiment, the use of high temperature processing may be undesirable for temperature-sensitive substrates, such as logic devices. The method of claim 1, wherein the substrate surface is maintained at a temperature in a range of about 350° C. to about 450° C. or in a range of about 300° C. to about 500° C.

In some embodiments, exposure to the transition metal precursor or the metal precursor (operation 212) occurs at a different temperature than the exposure to the oxidant (operation 226) or the chalcogenide precursor (operation 232). In some embodiments, the substrate is maintained at a first temperature in a range of 300° C. to 400° C. for the exposure to the metal precursor and/or the oxidant, and at a second temperature in the range of 400° C. to 450° C. for the exposure to the chalcogenide precursor. In some embodiments, both the metal and chalcogenide precursors are delivered at the same substrate temperature.

One or more embodiment of the disclosure are directed to methods of depositing transition metal dichalcogenide films in high aspect ratio features. A high aspect ratio feature is a trench, via or pillar having a height:width ratio greater than or equal to about 10, 20, or 50, or more. In some embodiments, the transition metal-containing film is deposited conformally on the high aspect ratio feature. As used in this manner, a conformal film has a thickness near the top of the feature that is in the range of about 90-110% of the thickness at the bottom of the feature.

According to one or more embodiment, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiment, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiment, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiment, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiment, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiment" or "an embodiment" means that a particular feature, structure, material, or characteristic described in connection with the embodiment is included in at least one embodiment of the disclosure. Thus, the appearances of the phrases such as "in one or more embodiment," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiment.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a transition metal dichalcogenide film, the method comprising:
   depositing a transition metal oxide film on a substrate surface by sequentially exposing the substrate surface to a metal precursor, purge gas, an oxidant comprising one or more of $H_2O$, $O_2$, or $O_3$, and the purge gas; and
   converting the transition metal oxide film to the transition metal dichalcogenide film, wherein the transition metal dichalcogenide film is a channel material in a 3D NAND device, and the method is a thermal method that is performed without the use of plasma.

2. The method of claim 1, wherein the substrate surface does not contain a barrier layer.

3. The method of claim 1, wherein the substrate surface is maintained at a temperature in a range of about 350° C. to about 450° C.

4. The method of claim 1, wherein the substrate surface comprises a dielectric material.

5. The method of claim 1, wherein the substrate surface comprises at least one feature with an aspect ratio greater than or equal to about 10:1.

6. The method of claim 1, wherein depositing the transition metal oxide film comprises directly forming the transition metal oxide film without forming a transition metal film intermediate.

7. The method of claim 1, wherein the metal precursor does not comprise oxygen or halogen atoms.

8. The method of claim 1, wherein the metal precursor comprises bis(t-butylimino) bis(dimethylamino) tungsten or bis(t-butylimino) bis(dimethylamino)molybdenum.

9. The method of claim 1, wherein converting the transition metal oxide film is performed at a pressure in a range of from 5 Torr to 20 Torr.

10. The method of claim 1, wherein converting the transition metal oxide film to the transition metal dichalcogenide film comprises exposing the transition metal oxide film to a chalcogenide precursor comprising one or more of sulfur(S), selenium (Se) or tellurium (Te).

11. The method of claim 10, wherein the chalcogenide precursor comprises $H_2S$.

12. The method of claim 1, wherein 20 Å to 30 Å of the transition metal oxide film is formed before converting the transition metal oxide film.

13. The method of claim 1, wherein only a monolayer of the transition metal oxide film is formed before converting the transition metal oxide film.

14. The method of claim 13, wherein the method is repeated to form the transition metal dichalcogenide film to a thickness in a range of 20 Å to 30 Å.

15. The method of claim 1, wherein the transition metal dichalcogenide film is substantially free of oxygen.

16. The method of claim 1, wherein the substrate surface comprises at least one feature and the transition metal dichalcogenide film is substantially conformal over the at least one feature.

17. The method of claim 1, wherein depositing the transition metal oxide film on the substrate surface and converting the transition metal oxide film to the transition metal dichalcogenide film are performed in a single processing chamber.

18. A method of forming a transition metal dichalcogenide film on a substrate surface comprising at least one feature, the method comprising:

sequentially exposing the substrate surface to a metal precursor, purge gas, an oxidant, and the purge gas to directly deposit a transition metal oxide film, the metal precursor comprising bis(t-butylimino) bis(dimethyl-amino) tungsten or bis(t-butylimino) bis(dimethyl-amino) molybdenum, the transition metal oxide film being substantially conformal over the at least one feature;

exposing the transition metal oxide film to a chalcogenide precursor to convert the transition metal oxide film to the transition metal dichalcogenide film, the chalco-genide precursor comprising $H_2S$, wherein converting the transition metal oxide film is performed at a pres-sure of 1 Torr, the transition metal dichalcogenide film is a channel material in a 3D NAND device and has a thickness in a range of 20 Å to 30 Å, the substrate surface is maintained at a temperature in a range of about 350° C. to about 450° C., and the method is a thermal method that is performed without the use of plasma.

\* \* \* \* \*